United States Patent
Park

(10) Patent No.: US 6,977,562 B2
(45) Date of Patent: Dec. 20, 2005

(54) SELF-TUNED MATCHING NETWORK FOR HIGH EFFICIENT POWER AMPLIFIERS

(75) Inventor: Chul Hong Park, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 57 days.

(21) Appl. No.: 10/251,273

(22) Filed: Sep. 19, 2002

(65) Prior Publication Data

US 2004/0056733 A1    Mar. 25, 2004

(51) Int. Cl.[7] .............................................. H03H 7/38
(52) U.S. Cl. ........................ 333/32; 333/262; 330/305
(58) Field of Search .................. 333/32, 262; 330/305, 330/149

(56) References Cited

U.S. PATENT DOCUMENTS

| | | | | |
|---|---|---|---|---|
| 3,430,157 A | * | 2/1969 | Wood | 330/192 |
| 3,437,931 A | * | 4/1969 | Schultz, Jr. | 455/121 |
| 3,919,656 A | * | 11/1975 | Sokal et al. | 330/51 |
| 5,300,895 A | * | 4/1994 | Jones | 330/251 |
| 6,160,449 A | * | 12/2000 | Klomsdorf et al. | 330/149 |
| 6,304,153 B1 | * | 10/2001 | De Los Santos | 331/117 D |
| 6,404,304 B1 | * | 6/2002 | Kwon et al. | 333/202 |
| 6,621,370 B1 | * | 9/2003 | Dao | 333/25 |
| 6,621,376 B2 | * | 9/2003 | Liu et al. | 333/126 |
| 6,670,864 B2 | * | 12/2003 | Hyvonen et al. | 333/32 |

OTHER PUBLICATIONS

Dec et al., Micromachined Electro-Mechanically Tunable Capacitors and Their Applications to RF IC's, IEEE Transactions on Microwave Theory and Techniques, vol. 46, No. 12, Dec. 1998.*

* cited by examiner

Primary Examiner—Stephen E. Jones

(57) ABSTRACT

A passive interface circuit for coupling an output signal from a power amplifier to a load is disclosed. The interface presents an impedance to the power amplifier that increases as the power level in the output signal decreases. In one embodiment, the interface circuit includes a fixed network and a capacitor having a capacitance that varies with the potential across the capacitor. The fixed network couples the output signal to the load. The capacitor is connected in parallel with the load and has a capacitance that increases in response to an increase in potential across the capacitor. The capacitor is preferably a MEM capacitor having plates that move with respect to one another in response to changes in the average potential difference between the plates.

10 Claims, 4 Drawing Sheets

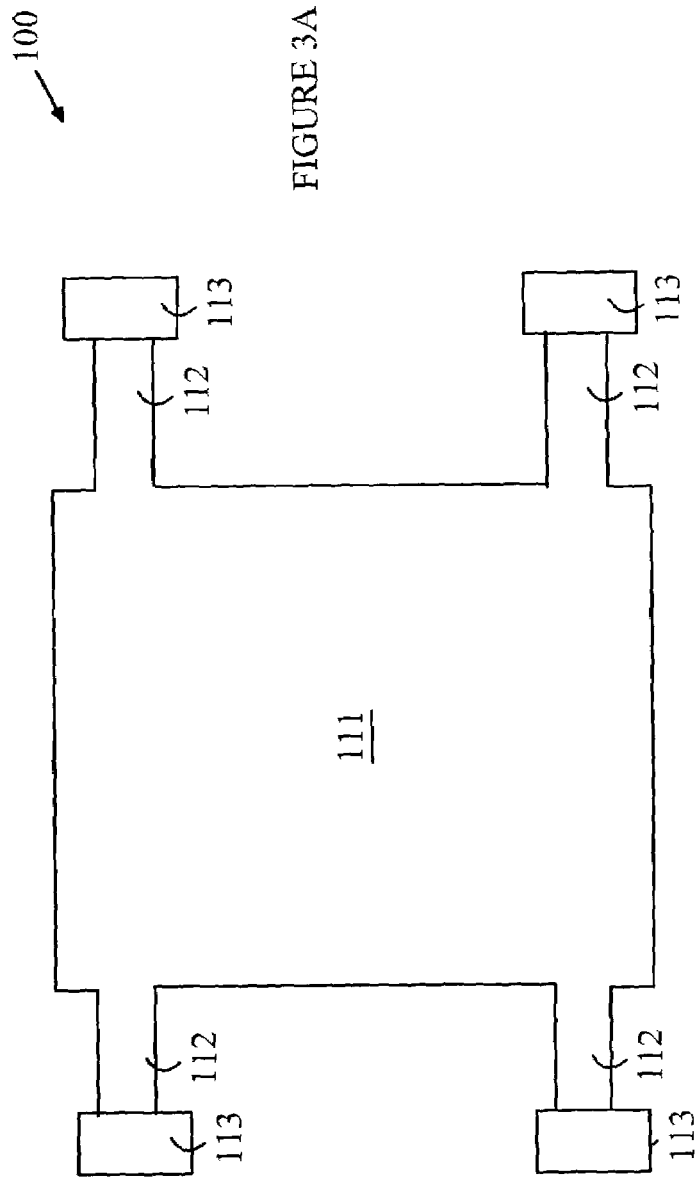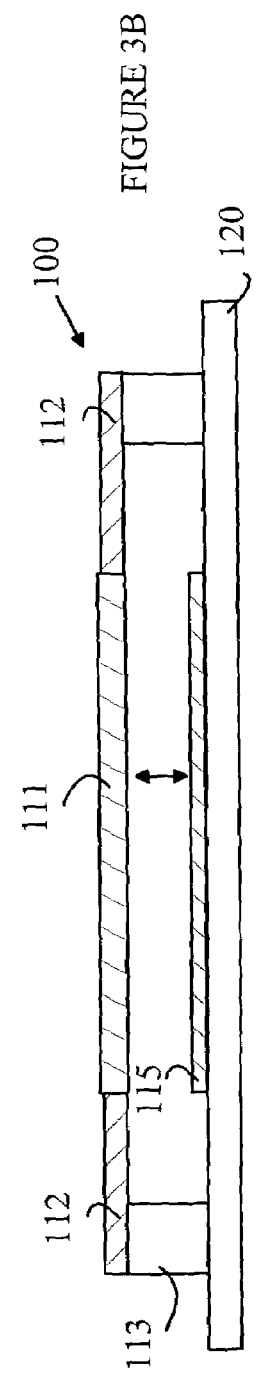

SELF-TUNED MATCHING NETWORK FOR HIGH EFFICIENT POWER AMPLIFIERS

FIELD OF THE INVENTION

The present invention relates to electronic circuits, and more particularly, to circuits that couple power amplifiers to a load.

BACKGROUND OF THE INVENTION

To simplify the following discussion, consider the output stage of a cellular telephone. The output stage includes a power amplifier that drives an antenna. The efficiency of the power amplifier will be defined to be the power delivered into the load divided by the power consumed by the power amplifier. The efficiency of the amplifier depends on the impedance of the load being driven. For any given power level, a fixed matching network can be included between the antenna and the power amplifier such that the efficiency of the power amplifier is maximized.

Unfortunately, the power amplifier in certain cellular telephones must operate at a number of different power outputs. The power output by the cellular telephone is varied such that the signal received by the base station is more or less constant independent of the distance from the cellular telephone to the base station. When the cellular telephone is far from the base station, the output amplifier is set to generate the maximum allowed power. When the cellular telephone is close to the base station, the power level is reduced to a small fraction of the maximum allowed power.

A fixed matching network can only provide optimum power efficiency at one power level. In cellular communications, the power amplifier is typically set to provide high efficiency at the maximum power level. For example, the power efficiency of a cellular telephone varies from a few percent at the lowest power output setting to approximately 50% at the maximum power setting. This decreased power efficiency decreases the time interval between required recharging, and hence, is undesirable.

In principle, an active matching network can be utilized to provide a more constant power efficiency as a function of the output power of the power amplifier. However, such networks require power and add additional components that increase the cost of the cellular telephone.

SUMMARY OF THE INVENTION

The present invention is a passive interface circuit for coupling an output signal from a power amplifier to a load. The interface presents an impedance to the power amplifier that increases as the power level in the output signal decreases. In one embodiment, the interface circuit includes a fixed network and a capacitor having a capacitance that varies with the potential across the capacitor. The fixed network couples the output signal to the load. The capacitor is connected in parallel with the load and has a capacitance that increases in response to an increase in potential across the capacitor. The capacitor is preferably a micro-machined (MEM) capacitor having plates that move with respect to one another in response to changes in the average potential difference between the plates.

BRIEF DESCRIPTION OF THE DRAWINGS

FIGS. 3A and 3B are top and side views, respectively, of a MEM variable capacitor 100.

DETAILED DESCRIPTION OF THE PREFERRED EMBODIMENTS OF THE PRESENT INVENTION

The present invention provides a matching network having an impedance that increases as the power output of the amplifier decreases, and hence, provides improved power efficiency at low power levels in systems that are optimized to provide high efficiency at high power levels. The present invention is based on a class of micro-machined capacitors that alter their capacitance as a function of the voltage across the plates of the capacitor.

Parallel plate capacitors having a capacitance that depends on the potential difference between the plates are well known in the electrical arts. The devices typically consist of a fixed bottom plate and a movable top plate that is held over the bottom plate with the aid of a number of springs. As the potential difference between the plates is increased, the top plate is pulled toward the bottom plate by the electrostatic forces against the restoring forces provided by the spring system. Variable capacitors of this type are described in Darrin J. Young and Bernhard E. Boser, "A Micromachined Variable Capacitor for Monolithic Low-Noise VCOs," Technical Digest of Solid-State Sensor and Actuator Workshop, 1996, pp. 86–89 and in Aleksander Dec and Ken Suyama, "Micromachined Electro-Mechanically Tunable Capacitors and Their Applications to RF IC's," IEEE Transactions on Microwave Theory and Techniques, vol. 46, no. 12, Part 2, December 1998, pp. 2587–2596.

It should be noted that the force that attracts the plates together does not depend on the sign of the potential difference between the plates. Hence, if an AC voltage is applied to one plate while the other plate is held at ground, the capacitance of the capacitor will increase as a function of the amplitude of the AC signal. It should also be noted that such micromachined (MEM) capacitors do not require any additional circuitry to provide this change in capacitance as a function of the AC signal strength applied between the plates. In addition, the capacitor does not draw a significant amount of power. That is, the interface network of the present invention is completely passive. The term "passive" being defined as no source of energy or electromotive force except the AC signal strength. The present invention also provides an averaging function. The MEM capacitor-based interface of the present invention has a response that is very slow compared to the signals being transmitted. Hence, the present invention responds to the average potential difference instead of a peak potential difference, which exists in the frequency modulation schemes utilized in applications such as CDMA or W-CDMA.

Figure 1:
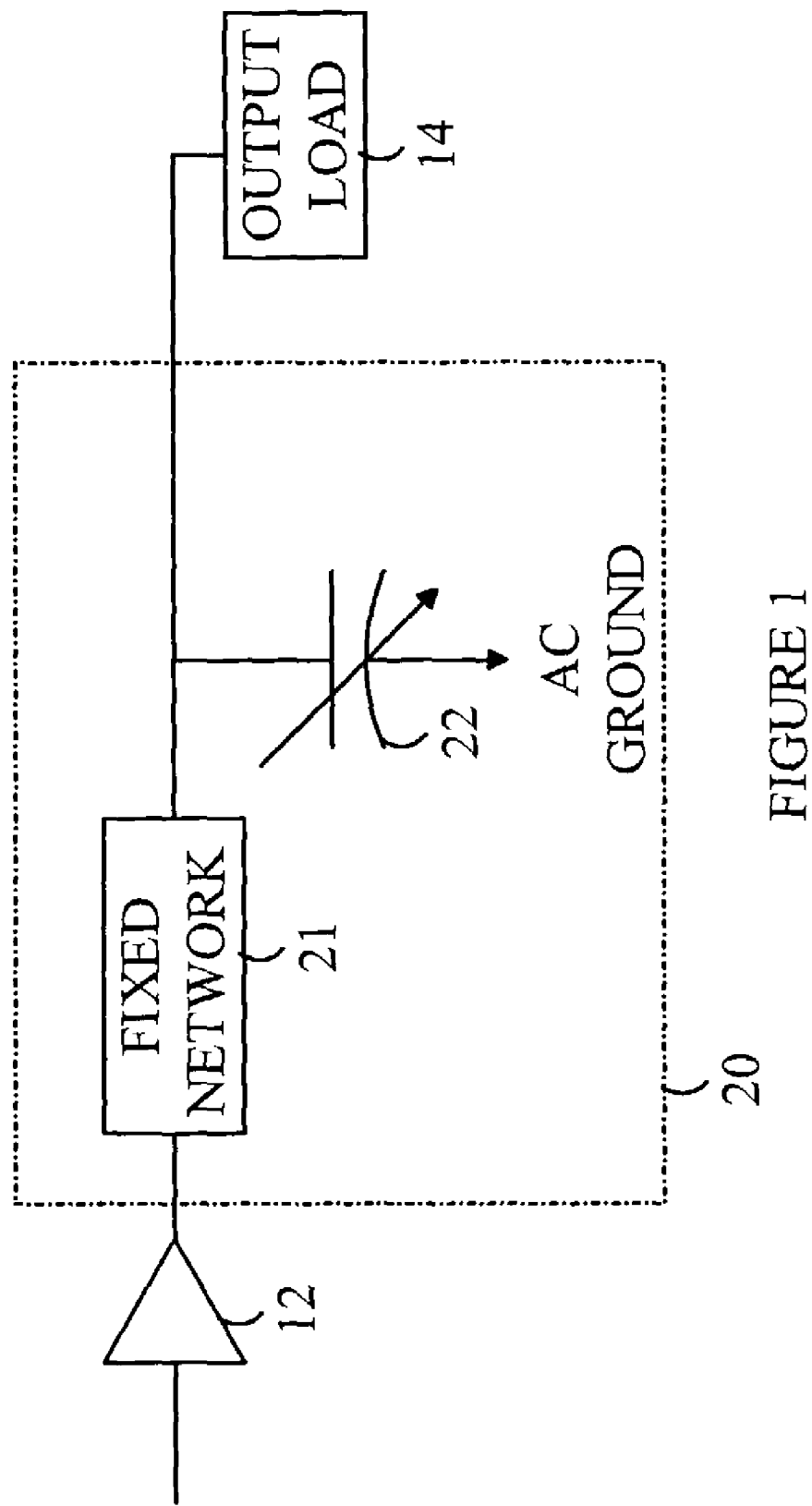
FIG. 1 is a schematic drawing of a matched network 20 according to the present invention connected between a power amplifier 12 and a load 14.

Refer now to FIG. 1, which is a schematic drawing of a matched network 20 according to the present invention connected between a power amplifier 12 and a load 14. Matched network 20 includes a fixed network 21 connected to a MEM capacitor 22. As the power generated by power amplifier 12 increases, the capacitance of the MEM capacitor 22 increases. Fixed network 21 is chosen such that the impedance of the combination of fixed network 21 and MEM capacitor 22 increases as the root-mean-square voltage across matching network 20 increases.

Figure 2:
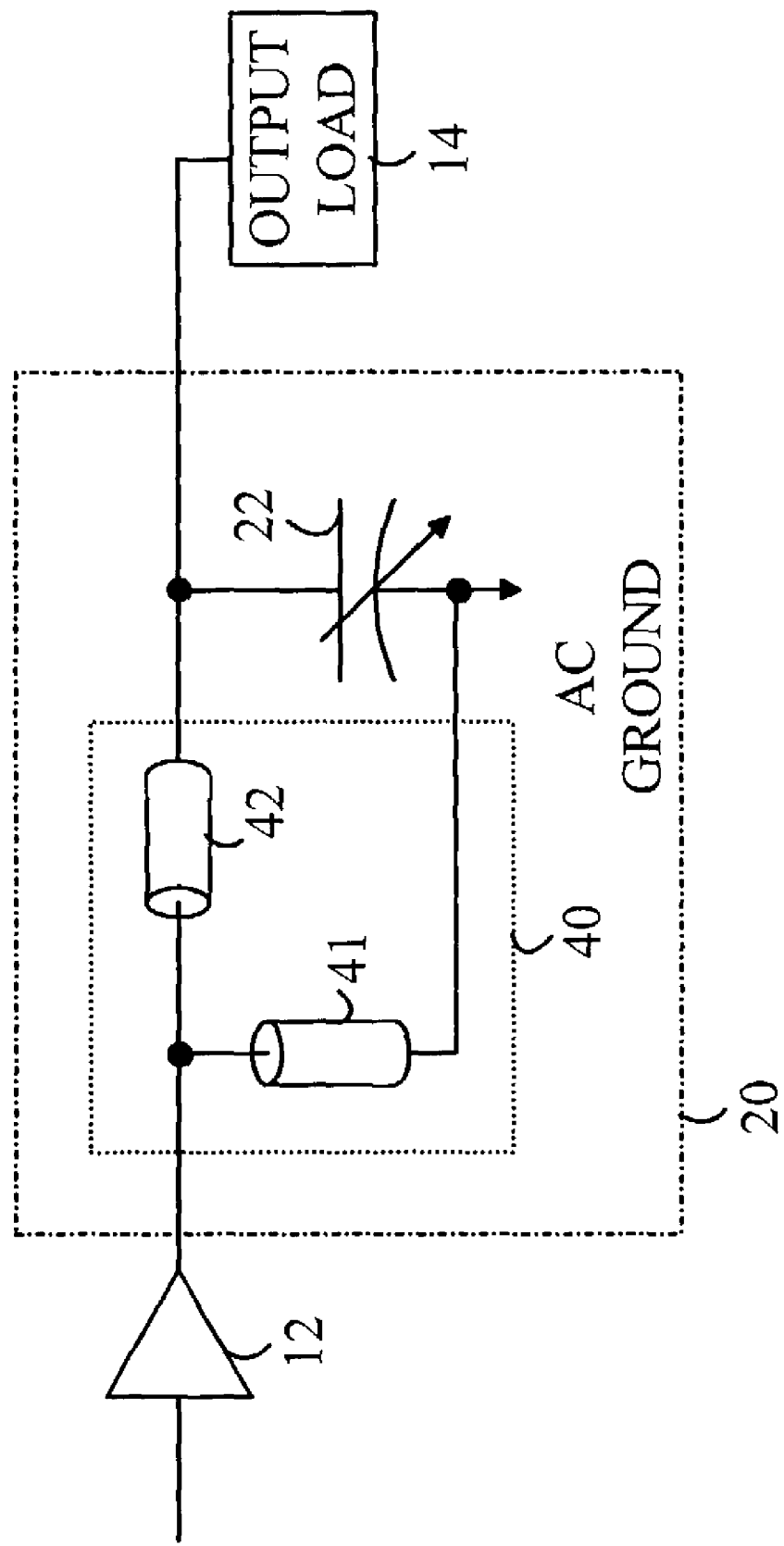
FIG. 2 is a schematic drawing of a fixed network 40 according to one embodiment to the present invention.

Refer now to FIG. 2, which is a schematic drawing of a fixed network 40 according to one embodiment to the present invention. Fixed network 40 is constructed from two coaxial transmission lines. Transmission line 42 connects the power amplifier to the MEM capacitor. Transmission line 41 is connected across the MEM capacitor. In one exemplary embodiment, power amplifier 12 has an output impedance of (12.01+j3.44) Ω and is amplifying a carrier having a frequency of 1.880 GHz. For a load having an impedance of (50+j0.03) Ω, the transmission lines have a length equal to 0.050 times the wavelength of the carrier and an impedance of 50Ω. The MEM capacitor is constructed such that its capacitance varies from 3.0 pF at the low power setting to 4.5 pF at the high power setting.

As noted above, for any given power level, the matching network impedance that provides the optimum power efficiency can be computed. The present invention utilizes a MEM capacitor that has a capacitance adjusted such that the matching network impedance is at or near optimum at both the high and low power output extremes of the power amplifier operating range. The manner in which this is accomplished can be more easily understood with reference to FIGS. 3A and 3B, which are top and side views, respectively, of a MEM variable capacitor 100. Variable capacitor 100 has a top plate 111 that is suspended by springs 112 over a bottom plate 115. Each spring is attached to a support 113 at one end and plate 111 at the other end. The plates and other components are constructed over a substrate 120.

The capacitance depends on the plate area and the distance between the plates of the capacitor. The distance between the plates depends on the displacement of the plates at the low power setting, on the spring constant of the springs on which the top plate is suspended, and on the difference in attractive force on the plates between the low and high power states. The spring constant of the springs, in turn, depends on the material from which the springs are constructed and on the physical dimensions of the springs. For a simple cantilevered support arm having a width, W, length L, and thickness, T, the spring constant is proportional to $WT^3/L$. Hence, the spring constant can be altered by changing any of the physical dimensions as well as the material from which the spring is constructed.

Figure 4:
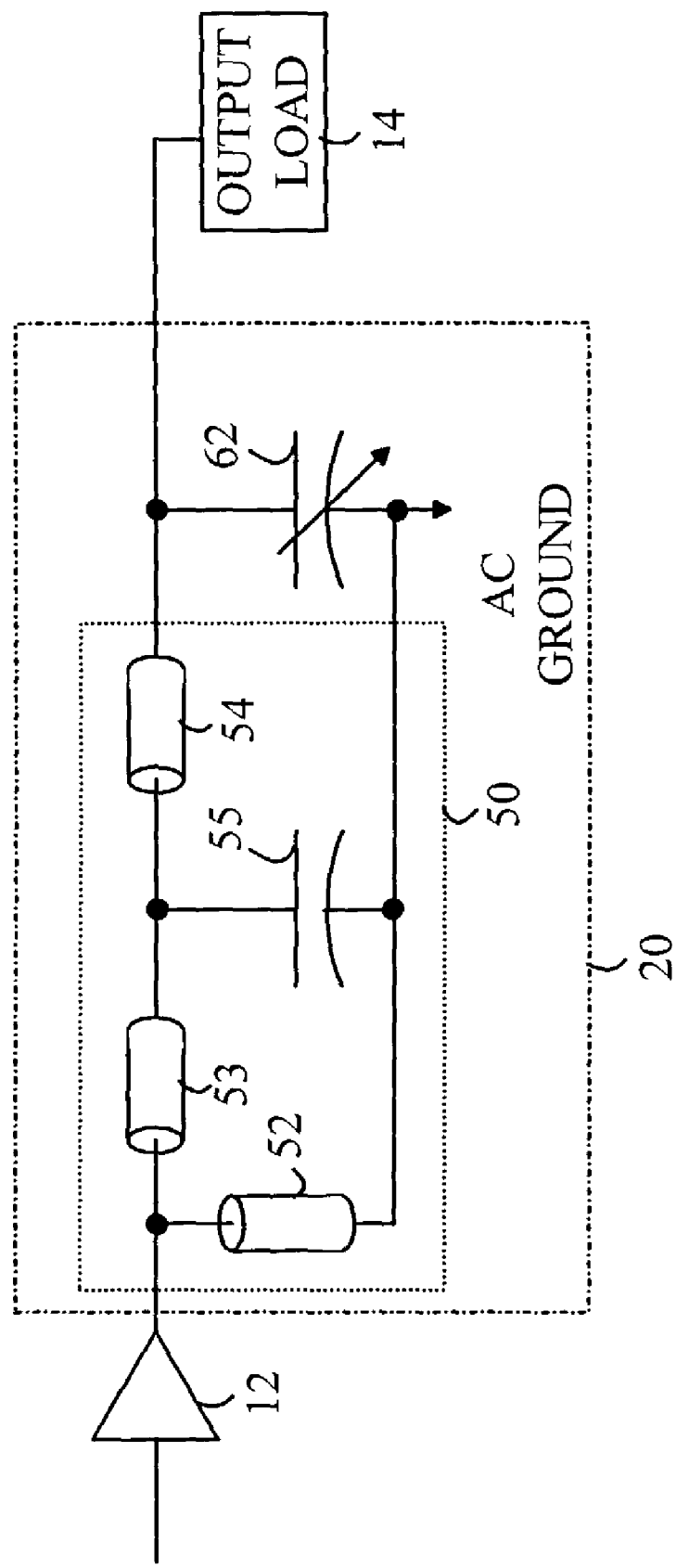
FIG. 4 is a schematic drawing of a fixed network 50 according to another embodiment to the present invention.

While the above-described embodiments of the present invention have utilized a particular form of fixed matching network, other fixed matching networks can be utilized without departing from the teachings of the present invention. Refer now to FIG. 4, which is a schematic drawing of a fixed network 50 according to another embodiment to the present invention. Fixed network 50 is constructed from three coaxial transmission lines 52–54 and a fixed capacitor 55. Transmission lines 53 and 54 connect the power amplifier to the MEM capacitor. Transmission line 52 is connects the power amplifier output to ground. In one exemplary embodiment, power amplifier 12 has an output impedance that varies from (10.69+j3.13) Ω to (3.50+j2.43)Ω and is amplifying a carrier having a frequency of 1.880 GHz. The load has an impedance of 50Ω in this example. Transmission lines 52–54 each have an impedance of 50Ω. Transmission lines 52–54 have lengths equal to 0.040, 0.027, and 0.032 times the wavelength of the carrier, respectively. Fixed capacitor 55 has a capacitance of 2 pF. MEM capacitor 62 is constructed such that its capacitance varies from 2.0 pF at the low power setting to 4.0 pF at the high power setting.

Various modifications to the present invention will become apparent to those skilled in the art from the foregoing description and accompanying drawings. Accordingly, the present invention is to be limited solely by the scope of the following claims.

What is claimed is:

1. An interface circuit for coupling an input signal to a load, said circuit comprising:
   a network having a fixed impedance for coupling said input signal to said load; and
   a capacitor connected in parallel with said load, said capacitor having a capacitance that increases in response to an increase in the amplitude of said input signal across said capacitor, wherein said interface circuit is passive.

2. The interface circuit of claim 1 wherein said capacitor comprises a first plate and a second plate suspended over said first plate, the distance between said first plate and said second plate decreasing when said input signal is applied between said first and second plates, the magnitude of said decrease depending on said amplitude of said input signal.

3. The interface circuit of claim 2 wherein said second plate is suspended over said first plate by a spring.

4. The interface circuit of claim 1 wherein said network comprises a plurality of transmission lines.

5. The interface circuit of claim 4 wherein said network comprises a capacitor.

6. The interface circuit of claim 4 wherein said plurality of transmission lines comprises:
   a first transmission line connecting said input signal to said load; and
   a second transmission line connecting said input signal to ground by a DC path.

7. An amplifier stage for applying an amplified input signal to a load, said amplifier stage comprising:
   a power amplifier for amplifying an input signal to generate an output signal on an output node; and
   a passive network connected between said output node and said load, said passive network characterized by a coupling impedance which varies with the magnitude of said output signal such that the magnitude of said coupling impedance increases as said magnitude of said output signal decreases.

8. The amplifier stage of claim 7 wherein said passive network comprises:
   a fixed network having a fixed impedance for coupling said output node to said load; and
   a capacitor connected in parallel with said load, said capacitor having a capacitance that increases in response to an increase in the amplitude of said input signal across said capacitor.

9. A method for applying a signal to a load comprising:
   providing a power amplifier for receiving said signal and generating an amplified signal on an output node, said power amplifier having an efficiency that increases with the magnitude of said amplified signal; and
   providing a passive network connected between said output node and said load, said passive network characterized by a coupling impedance which varies with the magnitude of said output signal such that the magnitude of said coupling impedance increases as said magnitude of said output signal decreases.

10. The method of claim 9 wherein said passive network comprises:
    a fixed network having a fixed impedance for coupling said output node to said load; and
    a capacitor connected in parallel with said load, said capacitor having a capacitance that increases in response to an increase in the amplitude of said amplified signal across said capacitor.

* * * * *